United States Patent [19]

Mirle et al.

[11] Patent Number: 5,143,819
[45] Date of Patent: Sep. 1, 1992

[54] AQUEOUS DEVELOPING, PHOTOCURABLE COMPOSITION, PHOTOSENSITIVE ARTICLES HAVING LAYERS MADE THEREFROM AND METHOD OF IMPROVING THOSE ARTICLES

[75] Inventors: Srinivas K. Mirle; Arthur L. Berrier, both of Ellicott City, Md.

[73] Assignee: W. R. Grace & Co.-Conn., New York, N.Y.

[21] Appl. No.: 645,848

[22] Filed: Jan. 25, 1991

[51] Int. Cl.$^5$ ............... G03C 1/725; G03F 7/025
[52] U.S. Cl. ................... 430/286; 430/281; 430/285; 430/906; 430/910
[58] Field of Search ............ 430/286, 285, 281, 906, 430/910

[56] References Cited

U.S. PATENT DOCUMENTS

| | | | |
|---|---|---|---|
| 2,893,868 | 7/1959 | Barney | 430/281 |
| 4,272,608 | 6/1981 | Proskow | 430/288 |
| 4,275,142 | 6/1981 | Hosaka et al. | 430/271 |
| 4,952,481 | 8/1990 | Seio et al. | 430/284 |

FOREIGN PATENT DOCUMENTS

| | | |
|---|---|---|
| 614181 | 2/1961 | Canada . |
| 0164270 | 11/1985 | European Pat. Off. . |
| 0198392 | 10/1986 | European Pat. Off. . |
| 0260943 | 3/1988 | European Pat. Off. . |
| 0261910 | 3/1988 | European Pat. Off. . |
| 0295944 | 12/1988 | European Pat. Off. . |
| 2171107A | 8/1986 | United Kingdom . |

*Primary Examiner*—Marion E. McCamish
*Assistant Examiner*—Mark A. Chapman
*Attorney, Agent, or Firm*—Valerie E. Looper; Steven T. Trinker

[57] ABSTRACT

A photocurable composition suitable for flexible photosensitive articles is prepared by reacting an acid-containing copolymer and a nitrogen-containing compound having polymerizable ethylenically unsaturated groups. The resulting composition can be used "as is" or can be formulated with ethylenically unsaturated monomers and photoinitiators to prepare the flexible photosensitive articles, e.g. flexographic printing plates. The plates prepared from the photocurable composition are aqueous developable and sufficiently flexible and soft to be used for printing on flexible packaging surfaces.

34 Claims, No Drawings

AQUEOUS DEVELOPING, PHOTOCURABLE COMPOSITION, PHOTOSENSITIVE ARTICLES HAVING LAYERS MADE THEREFROM AND METHOD OF IMPROVING THOSE ARTICLES

FIELD OF THE INVENTION

This invention relates to photocurable prepolymers and formulations or compositions containing the same, as well as flexible photosensitive articles having solid surfaces or layers prepared from such prepolymers or formulations. The invention also relates to a method of improving the aqueous developability and solvent resistance of a photosensitive article.

BACKGROUND OF THE INVENTION

Photocurable prepolymers and compositions are well known in the art for forming printing plates and other photosensitive or radiation sensitive articles. In the field of photosensitive flexographic printing plates, the plates typically comprise a support and a photosensitive surface or layer prepared from a photocurable composition. Additional layers or surfaces on the plate include slip and release films to protect the photosensitive surface. Prior to processing the plate, the additional layers are removed, and the photosensitive surface is exposed to radiation in an imagewise fashion. The unexposed surfaces are then removed in developer baths.

Removal of unexposed surfaces comprising solid photocurable compositions such as those disclosed in U.S. Pat. No. 2,760,863 require the use of developer baths comprising environmentally unsafe, organic solvents such as tetrachloroethylene, 2-butanone, benzene, toluene, xylene, trichloroethane and solvent mixtures such as tetrachloroethylene/n-butanol. However, due to the toxicity, high volatility and low flash point of such solvents, their use gives rise to hazardous conditions and creates pollution problems. Thus, recently there has been a strong interest in the field to develop photosensitive layers in non-organic solvent developing solutions, e.g. aqueous, surfactant-aqueous or alkaline-aqueous solutions. However, the compositions resulting from recent attempts to achieve aqueous developable plates demonstrate deficiencies in mechanical properties, e.g. flexibility, softness, etc. See European Application 261,910.

For instance, in addition to possessing an aqueous developable photosensitive surface, a flexographic printing plate must have sufficient flexibility to wrap around a printing cylinder, yet be strong enough to withstand the rigors experienced during typical printing processes. Further, the printing plate should possess a low hardness, i.e. sufficient softness, to facilitate ink transfer during printing. A typical hardness goal for printing plates in the field of flexible printing plates has been a Shore A hardness in the range of about 30–60.

Previous aqueous developable compositions have not possessed all the desirable features such as flexibility, softness and solvent resistance to inks typically used in printing. For example, European Patent Application 261,910 describes an aqueous developable printing plate prepared from a photosensitive composition comprising a ternary copolymer and a basic nitrogen containing compound such as aminoacrylates. However, the applicants of the '910 patent application illustrate in their Table that their plates have Shore A hardnesses in the range of 66–81.

Furthermore, other water-developable photosensitive compositions which contain as the main component a high molecular weight polymer such as polyvinyl alcohol, cellulose, or the like, are also insufficient in flexibility and possess a high degree of rubber hardness and hence are unsuitable for use in flexographic printing plates. Finally, it is also important that the photosensitive layer of the printing plate be dimensionally stable during storage. For example, some compositions used for making plates have shown inferior stability properties when used in solid flexographic printing plates in that the compositions become tacky and pasty during storage. Those inferior properties have been attributed to the low molecular weight of the polymers used to prepare the printing plates. See U.S. Pat. No. 4,762,892 to Koch et al. and discussion of low molecular weight polymers disclosed in Japanese Kokoku 57-23693.

SUMMARY OF THE INVENTION

Accordingly, it is an object of the invention to prepare a novel photocurable composition which is suitable as an aqueous developable, storage stable, photosensitive solid surface or layer on a flexible photosensitive article such as a flexible printing plate, wherein the photocurable composition comprises (a) an acid-containing copolymer consisting essentially of monomer units of butadiene and a monomer of the formula:

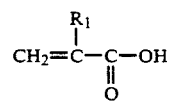

wherein $R_1$ is hydrogen or methyl and (b) a nitrogen containing compound having a polymerizable ethylenically unsaturated group, wherein said nitrogen-containing compound is present in an amount to render the composition suitable for use in a flexible photosensitive article.

It is an object of the invention to provide a photosensitive article comprising the novel photocurable composition.

It is a further object to develop a novel method for improving the aqueous development and solvent resistance of a flexible photosensitive article, wherein the method comprises preparing the article from the novel photocurable composition.

DETAILED DESCRIPTION

Acid-containing copolymer (a) is a copolymer consisting essentially of butadiene monomer units and (meth)acrylic acid monomer units of the formula

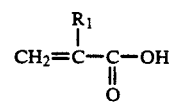

wherein $R_1$ is hydrogen or methyl. In a preferred embodiment $R_1$ is methyl.

Copolymer (a) is prepared according to well known polymerization techniques such as emulsion polymerization. The resulting copolymers can be in either solid or liquid form. Suitable solid copolymers include those having a Mooney viscosity of at least about 20 and no more than about 60, and most preferably in the range of 20 to 40. Suitable liquid copolymers have a weight average molecular weight in the range of 5,000 to 30,000. An example of a suitable liquid copolymer is butadiene-methacrylic acid copolymer having a molecular weight of 10,000 and a viscosity of greater than 2,000,000 centipose (cp) at 27° C. The acid content of the copolymers is relatively high when compared to other commercially available polymers and is preferably 0.1–0.5 ephr. The term "ephr" refers to equivalents of functional groups in 100 grams of the resin copolymer. Suitable solid and liquid copolymers can be obtained from B. F. Goodrich, Polysar and Nippon Zeon.

In the event that a liquid copolymer is used as the precursor, it is usually necessary to chain extend the copolymer until it becomes a solid. Otherwise, any photocurable composition resulting therefrom could have insufficient mechanical properties as well as dimensional instability. Chain extension is carried out by any difunctional chain extender such as 1,2,7,8 - octane diepoxide. The chain extension reaction is through acid groups on the copolymer's backbone.

As mentioned above, the nitrogen-containing compound (b) has a polymerizable ethylenically unsaturated group. Examples of such compounds include those embraced by the structural formulas I and II illustrated below.

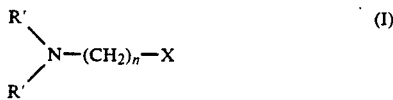

wherein X is

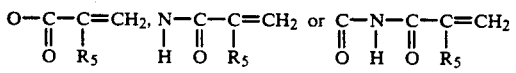

R' is hydrogen or an alkyl group containing 1 to 6 carbons, $R_5$ is hydrogen or methyl, and n is 1, 2 or 3;

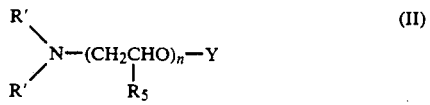

wherein Y is

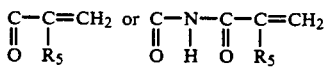

$R_5$ is hydrogen or methyl, n is in the range of 1 to 6 when R' is $CH_3$ and n is 2 to 6 when R' is $C_2H_5$.

Specific examples of compounds embraced by formulas I and II above include N,N-dimethylaminoethyl (meth)acrylate, N,N-diethylaminoethyl (meth)acrylate, t-butyl aminoethyl (meth)acrylate, N,N-dimethylaminopropyl (meth)acrylamide, N,N-dimethylaminoethyl-N'-(meth)acryloylcarbamate, or N,N-diethylamino-ethoxyethyl (meth)acrylate. The above compounds may be used alone or in combination with each other.

It is believed that addition of the nitrogen-containing compound forms a salt of the copolymer's acid groups and is needed to improve water dispersibility, i.e. aqueous developability, to the photocurable composition. See European Patent Application 295,444. To achieve the desired dispersibility, the amount of the nitrogen-containing compound (b) added should be about 5–18% by weight of copolymer (a). However, the amount of the nitrogen-containing compound should not be in excess of about 30% by weight of copolymer (a). Amounts greater than that result in plates with insufficient flexibility, i.e. too hard. The conditions for reacting (a) and (b), typically heating, e.g. 50° C., and mixing, are well known in the art.

Also, upon photoexposure, the photocurable product of copolymer (a) and compound (b) has superior solvent resistance over copolymer (a) and over the photocured composition of copolymer (a) when it is formulated with an equivalent number of reactive monomers. For instance, in general, improvement in solvent resistance is caused by the photo-crosslinking of the ethylenically unsaturated groups in the product of (a) and (b). Further improvements in solvent resistance are obtained by photo-crosslinking the ethylenically unsaturated groups in the product of (a) and (b) with other reactive monomers such as (meth)acrylates. When the product of (a) and (b) is used in flexographic printing plates, the improved solvent resistance of the photocured plates is beneficial in preventing dissolution of the cured areas in developing media and is desirable for printing with inks such as aqueous-based inks.

As indicated above, copolymer (a) may be used "as is." However, copolymer (a) may also be modified by additional chemistry prior to or after adding (a) to (b). For instance, it may be desirable to enhance the carboxylated copolymer's photocurability and, correspondingly, to improve its solvent resistance. In such instances, the copolymer can be modified by reacting it with a vinyl-containing compound so that the copolymer contains terminal and pendent photosensitive vinyl groups. The vinyl-containing compound used to modify the copolymer should also have an acid reactive functional group, e.g. an epoxy group, to react with the carboxylic acid groups on the copolymer. The additional vinyl groups afford greater photo-crosslinkability of the product created from (a) and (b) and can further enhance its solvent resistance. As with the reaction of the nitrogen-containing compound (b), the extent of modification by the vinyl-containing compound is limited to the amount that gives soft and flexible photocured materials. A suitable vinyl-containing compound for modifying (a) is glycidyl methacrylate.

When using a copolymer which has been modified by a vinyl-containing compound, the water dispersibility of the modified copolymer can also be enhanced by reacting the composition with an anhydride such as maleic anhydride.

A photocurable composition comprising the product of (a) and (b) can then be solvent cast, "as is", to create a solid photocurable layer on photosensitive articles. However, it is preferable to formulate the photocurable composition with a reactive monomer. When such monomers are used, the extent of their addition is limited by the attending increase in Shore A hardness and decrease in flexibility. A suitable amount of monomer would be in the range of about 1 to 20% by weight, and most preferably in the range of 5 to 15% by weight reactive monomer. Suitable reactive monomers are those of the formula:

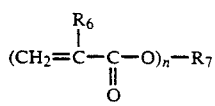

wherein $R_6$ is hydrogen or methyl, and $R_7$ is an organic moiety having the valence of n, and n is 1 or more. Such reactive acrylic diluents include, but are not limited to, trimethylolpropane triacrylate, hexanediol diacrylate, 1,3-butylene glycol diacrylate, diethylene glycol diacrylate, 1,6-hexanediol diacrylate, neopentyl glycol diacrylate, polyethylene glycol 200 diacrylate, tetraethylene glycol diacrylate, triethylene glycol diacrylate, pentaerythritol tetraacrylate, tripropylene glycol diacrylate, ethyloxylated bisphenol-A diacrylate, trimethylolpropane diacrylate, ditrimethylolpropane tetraacrylate, triacrylate of tris(hydroxyethyl) isocyanurate, dipentaerythritol hydroxypentaacrylate, pentaerythritol triacrylate, ethoxylated trimethlyolpropane triacrylate, triethylene glycol dimethacrylate, ethylene glycol dimethacrylate, tetraethylene glycol dimethacrylate, polyethylene glycol-200 dimethacrylate, 1,6-hexanediol dimethacrylate, neopentyl glycol dimethacrylate, polyethylene glycol-600 dimethacrylate, 1,3-butylene glycol dimethacrylate, ethoxylated bisphenol-A dimethacrylate, trimethylolpropane trimethacrylate, diethylene glycol dimethacrylate, 1,4-butanediol diacrylate, diethylene glycol dimethacrylate, pentaerythritol tetramethacrylate, glycerin dimethacrylate, trimethylolpropane dimethacrylate, pentaerythritol trimethacrylate, pentaerythritol dimethacrylate, pentaerythritol diacrylate and the like which can be added to the photopolymerizable composition to modify the cured product. Monoacrylates such as cyclohexyl acrylate, isobornyl acrylate, lauryl acrylate and tetrahydrofurfuryl acrylate and the corresponding methacrylates are also operable as reactive diluents.

Photoinitiators for the photocurable composition and formulations containing the same include the benzoin alkyl ethers, such as benzoin methyl ether, benzoin ethyl ether, benzoin isopropyl ether and benzoin isobutyl ether. Another class of photoinitiators are the dialkoxyacetophenones exemplified by 2,2-dimethoxy-2-phenylacetophenone, i.e. Irgacure®651 (Ciba-Geigy) and 2,2-diethoxy-2-phenylacetophenone. Still another class of photoinitiators are the aldehyde and ketone carbonyl compounds having at least one aromatic nucleus attached directly to the carboxyl group. These photoinitiators include, but are not limited to benzophenone, acteophenone, o-methoxybenzophenone, acenaphthenequinone, methyl ethyl ketone, valerophenone, hexanophenone, alpha-phenyl-butyrophenone, p-morpholinopropiophenone, dibenzosuberone, 4-morpholinobenzophenone, 4'-morpholinodeoxybezoin, p-diacetylbenzene, 4-aminobenzophenone, 4'-methoxyacetophenone, benzaldehyde, alpha-tetralone, 9-acetylphenanthrene, 2-acetylphenanthrene, 10-thioxanthenone, 3-acetylphenanthrene, 3-acetylindone, 9-fluorenone, 1-indanone, 1,3,5-triacetylbenzene, thioxanthen-9-one, xanthene-9-one, 7-H-benz[de]-anthracen-7-one, 1-naphthaldehyde, 4,4'-bis(dimethylamino)-benzophenone, fluorene-9-one, 1'-acetonaphthone, 2'-acetonaphthone, 2,3-butanedione, acetonaphthene, benz[a]anthracene 7.12 diene, etc. Phosphines such as triphenylphosphine and tri-o-tolylphosphine are also operable herein as photoinitiators. The photoinitiators or mixtures thereof are usually added in an amount ranging from 0.01 to 5% by weight of the total composition.

Other additives to the photocurable composition can be included. To inhibit premature crosslinking during storage of the photocurable compositions described herein, thermal polymerization inhibitors and stabilizers are added. Such stabilizers are well known in the art, and include, but are not limited to, hydroquinone monobenzyl ether, methyl hydroquinone, amyl quinone, amyloxyhydroquinone, n-butylphenol, phenol, hydroquinone monopropyl ether, phenothiazine and nitrobenzene, and mixtures thereof. Such additives are used in an amount within the range of from about 0.01 to about 2% by weight of the photocurable composition. These stabilizers are effective in preventing crosslinking of the composition during preparation, processing and storage.

The compositions also may contain up to about 50% by weight of an inert particulate filler which is essentially transparent to actinic light. Such fillers include the organophilic silicas, bentonites, silica and powdered glass. Such fillers can impart desirable properties to the photocurable compositions and reliefs on printing plates containing those compositions.

The photocurable composition can then be shaped and formed as a solid layer of suitable thickness according to conventional solvent casting, i.e. dissolving the composition in a solvent, shaping the solution into a film or plate and removing the solvent. Conventional extrusion calendaring or hot press techniques can also be used. Solid layers of the photocurable composition in the form of a film can be adhered to supports such as those comprising polyester, nylon or polycarbonate. Other suitable supports include woven fabrics and mats, e.g. 9lass fiber fabrics or laminated materials made of, for example, glass fibers and plastics. It is preferred that the supports are dimensionally stable and resistant to the washout solutions.

It is also usually necessary to protect photosensitive surfaces from contamination by dirt and dust during storage before being exposed and washed. Such protection is accomplished by lamination or application of a flexible protective cover sheet to the side of the photocurable composition opposite that of the support. In addition, the photocurable compositions can sometimes be tacky and it is thus also desirable to apply a release film to the surface of the photocurable layer before application of the coversheet. The release film may consist of a thin, flexible and water dispersible polymeric film and allows for intimate contact between the surface of the photocurable composition opposite to the support and an image bearing negative applied to the surface.

Photosensitive articles comprising a support and a solid layer or surface comprisinq the photocurable composition, e.g. solid flexographic printing plates, can then be processed by well known techniques for imagewise exposure to actinic light. Preferably, the light should have a wavelength of from about 230–450 nm. Exposure is through a negative placed between the light source and the photosensitive surface. Suitable sources of light include Type RS sunlamps, carbon arc lamps, xenon arc lamps, mercury vapor lamps, tungsten halide lamps and the like.

Exposure periods depend upon the intensity of the actinic light, thickness of the plate and the depth of the relief desired on the printing plate. Periods of from 2 to 20 minute exposures are preferred.

After exposure and the negative has been removed, the unexposed areas of the photocurable layer can be developed in aqueous solutions. Suitable solutions include those of nonionic and cationic surfactants, as well as basic and semi-aqueous basic solutions and combinations thereof. Such surfactants are commercially available as Triton® X-100 (non-ionic) and Triton RW-150 (cationic) from Rohm & Haas Company.

Flexible photosensitive articles having a Shore A hardness of 60 or less result from the above-described photocurable compositions. It has been found that articles having a Shore A of below 60 are flexible enough to wrap around printing plate cylinders, especially those used in printing on elastic commercial packaging film surfaces. Further, an accurate transfer of ink to the flexible, elastic packaging film surfaces is obtained from flexible and soft (Shore A of 60 or less) printing plates whose photocurable layer is prepared from the above-described photocurable composition. Moreover, the aforesaid flexible plates also possess sufficient strength to withstand the normal rigors experienced in a printing operation.

In order to further illustrate the practice of the present invention, the following examples are provided. However, these example are in no way meant to be limiting, but merely illustrative.

EXAMPLE 1

89 parts of a carboxylated polybutadiene polymer (acid ephr of about 0.3) were dissolved in approximately 120 parts of butyl acetate by mixing in a resin kettle fitted with an overhead stirrer, thermometer, heating mantle connected to a temperature controller and a reflux condenser. To the polymer solution were added 10 parts of diethylaminoethyl methacrylate, 1 part of 2,2-dimethoxy-2-phenylacetophenone (photoinitiator), 1.35 parts of Geltrol® anti-gelation agent from B. F. Goodrich and 0.27 parts of nitrobenzene (stabilizer). The kettle ingredients were mixed for 1 hour at 50° C.

The ionomerized polymer solution was de-aerated and solvent-cast to give a solid photocurable film. The solid film was actinically exposed to UV light in an image-wise fashion and washed in a 1% $Na_2CO_3$ solution to form a flexographic relief plate. The cured plate had a Shore A hardness of 59.

EXAMPLE 2

As in Example 1, 82.4 parts of an approximately 0.3 acid ephr carboxylated polybutadiene polymer were dissolved in 120 parts of butyl acetate. Along with 12.6 parts of diethylaminoethyl methacrylate were added 1.35 parts of Geltrol® anti-gelatin agent and 0.27 parts of nitrobenzene to the resin kettle. The ionomer of the carboxylated polybutadiene was formed by heating to 50° C. and mixing for 1 hour.

Subsequent to the above reaction, 4.2 parts of polypropylene glycol methacrylate and 0.8 parts of 2,2-dimethoxy-2-phenylacetophenone were added to the ionomer solution and mixed for 15 minutes.

The resulting ionomer solution was then processed as in Example 1. The cured plate had a Shore A hardness of 56.

EXAMPLE 3

A solution of 90 parts of carboxylated polybutadiene polymer having an acid ephr of about 0.3 in 270 parts of butanol and 90 parts of toluene was ionomerized with 11.6 parts of dimethylaminopropyl methacrylamide at 50° C. for 1 hour by mixing in a resin kettle. Also mixed in were 1.35 parts of Geltrol® anti-gelation agent and 0.27 parts of nitrobenzene and 1.94 parts of 2,2-dimethoxy-2-phenylacetophenone.

The ionomer solution was processed as in Examples 1 and 2. The cured plate had a Shore A hardness of 57.

EXAMPLE 4

85 parts of carboxylated polybutadiene polymer having about 0.3 acid ephr were dissolved in about 195 parts of butyl acetate. The polymer solution was heated to 90° C. and then 1.35 parts of Geltrol® anti-gelation agent, 0.85 parts of 1,8 diazabicyclo[5-4-0]undec-7-ene (catalyst) and 0.27 parts of nitrobenzene were added. Subsequently, 6% of the acid groups in the polymer backbone were reacted with 2.11 parts glycidyl methacrylate by heating the polymer solution at 90° C. for about 30 hours. The hydroxyl groups created from the glycidyl methacrylate adduction were then reacted with 1.45 parts maleic anhydride at 90° C. for 3 hours.

10 parts of diethylaminoethyl methacrylate were then added to the adducted polymer solution which had been cooled to 50° C. and then mixed with the aminomethacrylate for 1 hour. 2 parts of hexame diol dimethacrylate, 2 parts of dicyclopentenyl oxyethyl methacrylate and 1 part of 2,2-dimethoxy-2-phenylacetophenone were added to the polymer solution and mixed for 15 minutes.

The polymer solution was cast into a film and processed as in the above examples. The cured plate had a Shore A hardness of 57.

While the invention has been described above in terms of preferred embodiments and illustrated by examples, it is to be understood that variations and modifications may be resorted to as will be apparent to those skilled in the art. Such variations and modifications are to be considered within the purview and the scope of the claims appended hereto.

What is claimed:

1. A photocurable composition comprising
   (a) an acid-containing copolymer consisting essentially of monomer units of butadiene and monomer units of the formula:

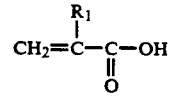

wherein $R_1$ is hydrogen or methyl, having an acid content in the range of 0.1–0.5 ephr, which is a solid having a Mooney viscosity of at least about 20 to 60 or a liquid having a weight average molecular weight of about 5,000 to 30,000 modified by a difunctional chain extender until it becomes a solid; and
   (b) a nitrogen-containing compound having a polymerizable ethylenically unsaturated group wherein said nitrogen-containing compound is present in an amount sufficient to render the composition suitable for use in a flexible photosensitive article.

2. A photocurable composition according to claim 1 wherein $R_1$ is methyl.

3. A photocurable composition according to claim 1 wherein the acid-containing copolymer (a) is modified by a vinyl-containing compound.

4. A photocurable composition according to claim 3 wherein the vinyl-containing compound is glycidyl methacrylate.

5. A photocurable composition according to claim 3 wherein the modified copolymer (a) is further reacted with anhydride.

6. A photocurable composition according to claim 1 wherein the nitrogen-containing compound (b) is diethylaminoethyl methacrylate.

7. A photocurable composition according to claim 1 wherein the nitrogen-containing compound (b) is dimethylaminopropyl methacrylamide.

8. A photocurable composition according to claim 1 further comprising an ethylenically unsaturated monomer (c) and a photopolymerization initiator (d).

9. A photocurable composition according to claim 8 wherein monomer (c) is a member of a group of monomers having a formula of

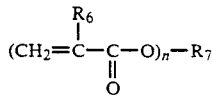

wherein $R_6$ is hydrogen or methyl and $R_7$ is an organic moiety having a valence of n, wherein n is 1 or more.

10. A photocurable composition according to claim 1 wherein compound (b) is present in the range of about 5–18% by weight of copolymer (a).

11. A photocurable composition according to claim 1 wherein compound (b) is present in an amount not exceeding about 30% by weight of copolymer (a).

12. A flexible photosensitive article comprising a substrate and a solid photocurable layer thereon, said layer comprising
(a) an acid-containing copolymer consisting essentially of monomer units of butadiene and monomer units of the formula:

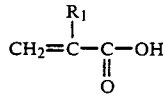

wherein $R_1$ is hydrogen or methyl, having an acid content in the range of 0.1–0.5 ephr, which is a solid having a Mooney viscosity of at least about 20 to 60 or a liquid having a weight average molecular weight of about 5,000 to 30,000 modified by a difunctional chain extender until it becomes a solid; and
(b) a nitrogen-containing compound having a polymerizable ethylenically unsaturated group.

13. An article according to claim 12 wherein $R_1$ is methyl.

14. An article according to claim 12 wherein the acid-containing compound (a) is modified by a vinyl-containing compound.

15. An article according to claim 14 wherein the vinyl-containing compound is glycidyl methacrylate.

16. An article according to claim 14 wherein the modified copolymer (a) is further reacted with anhydride.

17. An article according to claim 12 wherein the nitrogen-containing compound (b) is diethylaminoethyl methacrylate.

18. An article according to claim 12 wherein the nitrogen-containing compound (b) is dimethylaminopropyl methacrylamide.

19. An article according to claim 12 further comprising an ethylenically unsaturated monomer (c) and a photopolymerization initiator (d).

20. An article according to claim 19 wherein monomer (c) is a member of a group of monomers having a formula of

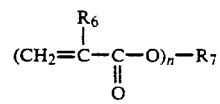

wherein $R_6$ is hydrogen or methyl and $R_7$ is an organic moiety having a valence of n, wherein n is 1 or more.

21. An article according to claim 12 wherein the Shore A hardness of said photocurable layer is in the range of 30–60.

22. An article according to claim 12 wherein compound (b) is present in the range of about 5–18% by weight of copolymer (a).

23. An article according to claim 12 wherein compound (b) is present in an amount not exceeding about 30% by weight of copolymer (a).

24. A method of making a flexible photosensitive article, wherein the improvement comprises reacting a copolymer consisting essentially of monomer units of butadiene and monomer units of the formula:

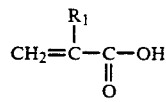

wherein $R_1$ is hydrogen or methyl, having an acid content in the range of 0.1–0.5 ephr, which is a solid having a Mooney viscosity of at least about 20 to 60 or a liquid have a weight average molecular weight of about 5,000 to 30,000 modified by a difunctional chain extender until it becomes a solid with a nitrogen-containing compound having a polymerizable ethylenically unsaturated group and recovering a photocurable composition.

25. A method according to claim 24 wherein $R_1$ is methyl.

26. A method according to claim 24 wherein said acid-containing copolymer is modified by a vinyl-containing compound.

27. A method according to claim 26 wherein the modified copolymer is further reacted with anhydride.

28. A method according to claim 24 wherein the vinyl-containing compound is glycidyl methacrylate.

29. A method according to claim 24 wherein the nitrogen-containing compound is diethylaminoethyl methacrylate.

30. A method according to claim 20 wherein the nitrogen-containing compound is dimethylaminopropyl methacrylamide.

31. A method according to claim 24 further comprising an ethylenically unsaturated monomer and a photopolymerization initiator.

32. A method according to claim 31 wherein the monomer is a member of a group of monomer having a formula of

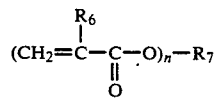

wherein $R_6$ is hydrogen or methyl and $R_7$ is an organic moiety having a valence of n, wherein n is 1 or more.

33. A method according to claim 24 wherein the nitrogen-containing compound is present in the range of about 5-18% by weight of the acid-containing copolymer.

34. A method according to claim 24 wherein the nitrogen-containing compound is present in an amount not exceeding about 30% by weight of the acid-containing copolymer.

* * * * *